(12) United States Patent
Motz

(10) Patent No.: US 7,705,571 B2
(45) Date of Patent: Apr. 27, 2010

(54) REVERSE-CONNECT PROTECTION CIRCUIT WITH A LOW VOLTAGE DROP

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 631 days.

(21) Appl. No.: 11/157,390

(22) Filed: Jun. 21, 2005

(65) Prior Publication Data

US 2006/0001099 A1   Jan. 5, 2006

(30) Foreign Application Priority Data

Jun. 21, 2004   (DE) .................. 10 2004 029 966

(51) Int. Cl.
*G05F 1/00* (2006.01)

(52) U.S. Cl. ..................... 323/268; 323/270

(58) Field of Classification Search ............ 323/266, 323/268, 270, 275, 277, 280, 282; 327/368, 327/328, 395, 536; 361/84, 58, 18; 257/355
See application file for complete search history.

(56) References Cited

U.S. PATENT DOCUMENTS

| | | | |
|---|---|---|---|
| 5,036,269 A * | 7/1991 | Murari et al. ............... 323/266 |
| 5,212,456 A | 5/1993 | Kovalcik et al. ............. 330/261 |
| 5,530,394 A | 6/1996 | Blossfeld et al. ............ 327/530 |
| 5,559,423 A * | 9/1996 | Harman ...................... 323/277 |
| 5,596,265 A | 1/1997 | Wrathall et al. ............. 323/315 |
| 6,005,378 A | 12/1999 | D'Angelo et al. ............ 323/313 |
| 6,504,424 B1 | 1/2003 | Heminger et al. ........... 327/566 |
| 6,600,297 B2 * | 7/2003 | Takeda et al. ............... 323/266 |
| 2003/0011350 A1 * | 1/2003 | Gregorius .................... 323/282 |
| 2004/0169550 A1 * | 9/2004 | Perrier et al. ................ 327/541 |

FOREIGN PATENT DOCUMENTS

| | | |
|---|---|---|
| DE | 36 15 049 C2 | 4/1994 |
| DE | 43 34 513 C1 | 10/1994 |
| DE | 196 40 272 C2 | 7/1998 |
| DE | 197 08 019 C2 | 5/2000 |

* cited by examiner

*Primary Examiner*—Bao Q Vu
*Assistant Examiner*—Jue Zhang
(74) *Attorney, Agent, or Firm*—Eschweiler & Associates, LLC

(57) ABSTRACT

Current supply circuit for supplying a circuit with an internal supply voltage on the basis of an external supply voltage with an bipolar transistor for realizing reverse-connect protection for the circuit to be supplied, a supply current flowing through the bipolar transistor's collector-emitter path, a regulating circuit connected to the bipolar transistor ensuring that the bipolar transistor is operated at the limit to saturation.

31 Claims, 6 Drawing Sheets

REVERSE-CONNECT PROTECTION CIRCUIT WITH A LOW VOLTAGE DROP

CROSS-REFERENCE TO RELATED APPLICATION

This application claims priority from German Patent Application No. 102004029966.8, which was filed on Jun. 21, 2004, and is incorporated herein by reference in its entirety.

TECHNICAL FIELD

The present invention generally relates to reverse-connect protection circuit (or polarity-inversion protection circuit) with a low voltage drop, and specifically relates to circuitry for protecting a circuit to be supplied from polarity inversion using a bipolar transistor.

BACKGROUND

In a plurality of technical applications it is desirable these days to operate an electronic circuit at an operating voltage which may vary within a wide range. In automobile applications, the operating voltage may vary, for example, between 3 volts and 34 volts. In addition, it is necessary to provide protection against polarity inversion of the operating voltage. For reasons of cost and reliability, the circuit for voltage stabilization and the reverse-connect protection are to be integrated on the integrated circuit to be supplied. To keep costs low and yield high, the additional technological expenditure due to monolithic integration of the circuits for voltage stabilization and for reverse-connect protection is to be as small as possible. It is admissible, for example, to use one to two additional uncritical masks in comparison with a conventional process. In addition, the circuit for voltage stabilization and reverse-connect protection is to be robust against technological variations.

Since the circuitries for voltage stabilization and for protection against polarity inversion are typically considered a unit and are also partly realized by one electronic component, it is necessary to consider the requirements placed upon the overall system consisting of voltage stabilization and reverse-connect protection.

The regulator mostly is required to provide good suppression of external operating-voltage variations, even at high frequencies, and to react in a very robust manner to other electrical interferences. This is to be achieved without using any external blocking capacities, since they increase the number of pins of the integrated circuit and cause additional cost. In addition, it is very important for the voltage drop across the overall circuit for voltage stabilization and reverse-connect protection to be as small as possible. A voltage drop of only 0.2 volt to 0.4 volt as a maximum between the external and internal supply voltages is desirable.

Currently, several circuitries are known which can realize both reverse-connect protection and voltage regulation. Typically, a suitably driven transistor serves as a voltage-regulating element, it being possible to use both bipolar transistors and field-effect transistors. One must differentiate between circuitries wherein the reverse-connect protection is guaranteed by the regulating transistor without any further expenditure in terms of circuitry, and circuitries wherein additional measures must be taken in terms of circuitry, in addition to the regulating transistor, to guarantee reverse-connect protection. When using high-voltage pnp bipolar transistors, reverse-connect protection is ensured by the vary sequence of layers of the transistor, and no additional reverse-connect protection diode is required. However, when using high-voltage pnp bipolar transistors, suppression of high-frequency interferences on the external supply voltage is poor due to the circuit concept required here and to the resulting high parasitic capacitances. Improving the circuit properties by using a vertical pnp bipolar transistor requires additional technology steps and is therefore not desirable. Similarly, with some technologies the production of high-voltage pMOS field-effect transistors requires additional technology steps. When using high-voltage pMOS field-effect transistors, reverse-connect protection is not a matter-of-course condition, since the n trough (=bulk) of the transistor is mostly connected to the external operating-voltage terminal and forms a parasitic diode to the p substrate (=mass). With this transistor type, protection against polarity inversion is possible only to a limited extent if the bulk terminal is not directly connected to the operating-voltage pin. Here, however, there is a risk of latch-up. If the bulk terminal is connected, via a resistor, to the operating-voltage pin and the source terminal of the transistor, a relatively large current may flow through the parasitic pnp transistor in reverse operation.

If high-voltage npn bipolar transistors or high-voltage nMOS field-effect transistors, which are connected as emitter followers or source followers, are used as regulating transistors, protection against polarity inversion is not ensured by the regulating transistor itself, since a parasitic diode to the substrate exists at the collector or drain. For reverse-connect protection, additional high-voltage pnp bipolar transistors or high-voltage diodes must be used. This increases the entire voltage drop across the regulating transistor and reverse-connect protection circuit with conventional circuitries to about 0.8 volt to 1 volt. In addition, npn bipolar transistors can be produced with additional technology only.

Furthermore, the drive circuit for the transistors varies depending on the type of transistor used. With high-voltage pnp bipolar transistors, driving may be effected via a current source connected to the reference potential. If a high-voltage pMOS field-effect transistor is used as a regulating transistor, same requires a voltage drive related to the external operating voltage. A high-voltage npn bipolar transistor is driven by a base current, the base potential being generally positive towards the internal operating voltage. When using a high-voltage nMOS field-effect transistor of the enhancement-mode type, the gate potential is, in normal operation, positive towards the regulated supply voltage. It is possible to achieve such a positive potential towards the internal supply voltage by means of a charge pump, this resulting, however, in a very slow control behavior since the gate reload current can only be very small due to the load pump.

With reference to FIGS. 4 and 5, some embodiments of monolithically integratable current supply circuits with reverse-connect protection and voltage regulation in accordance with the prior art will be explained in more detail.

FIG. 4 shows a current supply circuit designated by 10 in its entirety and which creates an internal voltage supply VDDint of 2.5 volts due to an external supply voltage VDDext which may vary between 3 and 34 volts. A lateral high-voltage pnp bipolar transistor 12 is connected, as a regulating transistor, between the external supply voltage VDDext and the internal supply voltage VDDint. This bipolar transistor 12 is used as a regulating transistor and ensures reverse-connect protection. The drive signal for bipolar transistor 12 is generated by a voltage regulation circuit 14 consisting of a "band gap" reference voltage source 16 and a transconductance amplifier 18 coupled thereto. A high-voltage n-channel MOSFET 20 is connected between the output of the transconductance amplifier 18 and the base terminal of bipolar transistor 12, as a high-voltage cascode so as to decouple the output of the transconductance amplifier from the high voltage at the base of the pnp transistor. The gate terminal of this field-effect transistor 20 is connected to the internal voltage supply VDDint. In addition, in the present circuit, there is an inevitable parasitic capacitance Cpar between the base terminal of the bipolar transistor 12 and the reference potential GND. In addition, the circuitry includes a sensor circuit 22 supplied by the internal supply voltage VDDint. All circuit components use the same reference potential GND.

In the circuitry of claim 4, the lateral high-voltage pnp bipolar transistor 12 acts as a regulating transistor and as reverse-connect protection at the same time. However, such a circuitry is sensitive towards high-frequency glitches on the external supply voltage VDDext. This is due, in particular, to the parasitic capacitance Cpar which fixes the base potential with respect to alternating voltage. Thus, high-frequency interferences on the external supply voltage VDDext strongly impact the voltage across the base-emitter path of the bipolar transistor 12, which results in poor suppression of high-frequency interferences on the external supply voltage VDDext. Slow variations of the external supply voltage VDDext, however, may be regulated via the voltage regulation circuit 14, via the field-effect transistor 20 used for decoupling the bipolar transistor from the regulating circuit, and via regulating transistor 12, so that the internal supply voltage is maintained constant. It is possible to replace the lateral high-voltage pnp bipolar transistor 12 by a vertical pnp bipolar transistor. Even though this reduces the parasitic capacitance and thus improves the circuit's behavior toward high-frequency interferences on the external supply voltage, it requires additional technology steps, which clearly increases manufacturing cost and reduces yield.

FIG. 5 shows the circuit diagram of a further embodiment of a current supply circuit with reverse-connect protection in accordance with the prior art, designated by 30 in its entirety. From an external supply voltage VDDext in the range of 3.5 volts to 34 volts, an internal supply voltage VDDint of 2.5 volts is generated. The reverse-connect protection here is achieved by a lateral high-voltage pnp bipolar transistor 32 which is clamped as a diode, i.e. its base and collector terminal are short-circuited. The emitter terminal is connected to the external supply voltage VDDext. A high-voltage npn bipolar transistor 34 is connected in series with this pnp bipolar transistor, the collector terminal of said high-voltage npn bipolar transistor 34 being connected to the collector terminal of the pnp bipolar transistor 32, and the emitter terminal of the high-voltage npn bipolar transistor 34 having applied thereto the internal supply voltage VDDint. Regulation of the internal supply voltage VDDint is performed, in turn, by a voltage regulation circuit 14 consisting of a "band gap" reference voltage source 16 and a transconductance amplifier 18. The control current available at the output of the transconductance amplifier 18 is supplied to the base of the regulating transistor 34 via a further high-voltage npn bipolar transistor 36 which is operated in the common-base circuit and acts as a high-voltage cascode. In addition, the constant-current source 38 is connected between the external supply voltage VDDext and the base of the regulating transistor 34 so as to allow an upward adjustment of the internal supply voltage via the high-voltage npn bipolar transistor 34. A sensor circuit 22, in turn, is supplied with the internal supply voltage VDDint.

In the present embodiment, a lateral high-voltage pnp bipolar transistor which is switched as a diode is thus used as reverse-connect protection. Here, a voltage drop of about 0.6 to 0.7 volt is to be expected across the emitter-collector path of the bipolar transistor 32. In addition, there is also a slight voltage drop across the collector-emitter path of the npn regulating transistor 34. Thus, the entire voltage drop across the reverse-connect protection circuit and the regulating transistor is about 0.8 to 1 volt. Thus, the external supply voltage VDDext must amount to at least 3.5 volts to be able to ensure internal supply voltage of 2.5 volts. Consequently, one may state that the circuitry shown does not meet the requirements placed upon it with regard to a small voltage drop. Thus, it is not suited for being employed in an environment with the above-mentioned specifications. What also is to be stated is that the production of the two npn bipolar transistors 34, 36 requires additional technology steps in comparison with standard CMOS technology. This, too, is unfavorable with regard to the goal of low manufacturing cost.

Further circuitries for voltage supply in accordance with the prior art may be found in the following patents: U.S. Pat. No. 5,530,394; U.S. Pat. No. 5,212,456; U.S. Pat. No. 5,596, 265; U.S. Pat. No. 6,005,378; U.S. Pat. No. 6,137,276; U.S. Pat. No. 6,504,424.

SUMMARY

Altogether it is to be stated that the above-mentioned requirements can be satisfactorily met neither using regulating transistors with integrated reverse-connect protection nor using regulating transistors in connection with a conventional separate reverse-connect protection element.

It is the object of the present invention to provide a reverse-connect protection circuit with a low voltage drop which may be realized at low-scale technological expenditure.

The present invention provides a current supply circuit for supplying a circuit with an internal supply voltage on the basis of an external supply voltage, having a bipolar transistor for realizing reverse-connect protection for the circuit to be supplied, a supply current flowing through the bipolar transistor's collector-emitter path, having a regulating circuit connected to the bipolar transistor for operating the bipolar transistor at the limit to saturation.

The present invention is based on the findings that there is only a small voltage drop across the collector-emitter path of a bipolar transistor if it is not connected, as is typical in conventional reverse-connect protection circuits, as a diode but is driven, at the base, with a current witch just about keeps it saturated. In addition, use is made of the findings that a lateral high-voltage bipolar transistor mostly may be manufactured in a conventional CMOS process without additional masks in a process-compatible manner. Similarly, the regulating circuit providing the base drive current for this bipolar transistor may be readily realized in the technology available. Thus it is possible, in contrast to the prior art, to provide a monolithically integratable reverse-connect protection circuit with a small voltage drop, which is independent of the regulating transistor used.

In a preferred embodiment, the bipolar transistor is kept at the limit to saturation by a regulating circuit for the base current, which is connected to the base.

In a further preferred embodiment, the regulating circuit for the base current comprises a bipolar transistor of a similar structure. The advantage thereof is that the base current may thereby be controlled such that it keeps the bipolar transistor at the limit to saturation in a manner which is independent of technology and temperature.

In accordance with a preferred embodiment, the bipolar transistor is a high-voltage pnp bipolar transistor or a high-voltage npn bipolar transistor. This has the advantage that the reverse-connect protection circuit may be operated without damage even at a high external supply voltage.

In a preferred embodiment, the bipolar transistor is a lateral high-voltage pnp bipolar transistor or a lateral high-voltage npn bipolar transistor. This has the advantage that the bipolar transistor may be manufactured in a CMOS process without additional masks in a process-compatible manner.

In a further embodiment, the bipolar transistor is a vertical high-voltage pnp bipolar transistor or a vertical high-voltage npn bipolar transistor.

In a further preferred embodiment, the bipolar transistor has a field-effect transistor for realizing voltage regulation for the circuit to be supplied connected with it in series, supply current flowing through the source-drain path of said field-effect transistor, and said field-effect transistor being driven by a voltage regulation circuit. This circuitry has the advantage that in addition to reverse-connect protection, a stabilization of the internal supply voltage may also be achieved. Both the bipolar transistor and the field-effect transistor may be manufactured at a very low additional technological expenditure compared to a conventional CMOS process.

In a preferred circuitry, the field-effect transistor is a depletion-type high-voltage n-channel MOSFET. Such a transistor may be manufactured starting from a common enhancement-mode-type MOSFET by means of one additional implantation step. Thus, in such a circuit configuration, only one additional uncritical implantation mask becomes necessary as compared with a standard CMOS process. This leads to low manufacturing costs. In addition, such a circuitry has the advantage that the regulating transistor may be driven directly from a circuit which itself is already operated at the regulated internal supply voltage. This improves the suppression of high-frequency interferences on the external supply voltage. In addition, this circuitry comprises a reliable starting behavior. Starting paths to the external supply voltage, which are susceptible to glitches on the external supply voltage, are not necessary.

In a further embodiment, the field-effect transistor is an enhancement-type high-voltage n-channel MOSFET. This circuitry offers the advantage that manufacturing may be conducted directly in a standard CMOS process without any additional implantation step. However, in this circuitry, a gate potential must be achieved which exceeds the potential of the internal supply voltage.

In a further embodiment, the gate potential of the enhancement-mode-type high-voltage n-channel MOSFET is generated using a charge pump driven in dependence on the output signal of a voltage regulation circuit. Such a circuitry offers the advantage that despite the use of an enhancement-mode type high-voltage n-channel MOSFET, which is technologically simple to produce, the drive voltage for this regulating transistor is produced from the internal supply voltage alone. Thus, the gate potential of the regulating transistor is largely independent of the external supply voltage, which reduces the coupling of interferences on the external supply voltage and allows operation at a small voltage drop.

In a further embodiment, the field-effect transistor is a barrier-layer field-effect transistor. This offers the benefit that the inventive reverse-connect protection circuit may also be used in connection with technologies wherein the production of MOS field-effect transistors is not provided. In addition, it may be said that barrier-layer field-effect transistors are essentially identical with depletion-type MOS field-effect transistors in terms of their electrical behavior. In particular, this means that they are normally on. Accordingly, barrier-layer field-effect transistors may be advantageously used just like depletion-type MOS field-effect transistors, but the additional technological expenditure required for manufacturing a depletion-type field-effect transistor is dispensed with.

In a further embodiment, the voltage regulation circuit for driving the field-effect transistor comprises a "band gap" reference voltage source, a transconductance amplifier, and a blocking capacitor connected to the gate of the field-effect transistor. The transconductance amplifier and the "band gap" reference voltage source may be combined in one circuit, so that the circuit expenditure for the regulating circuit is low.

The advantage of such a circuitry is that the internal supply voltage may be kept very stable even with large variations of the external supply voltage. In particular, it is possible to operate the "band gap" reference voltage source and the transconductance amplifier at the stabilized internal supply voltage. This yields the benefit that interferences on the external supply voltage have no direct influence on the voltage regulation circuit. If a depletion-type high-voltage n-channel MOSFET or a barrier-layer high-voltage field-effect transistor is used as a regulating transistor, the gate terminal of this field-effect transistor may be directly connected to the output of the transconductance amplifier. The benefits of such a circuitry are that an additional transistor between the output of the transconductance amplifier and the gate terminal of the field-effect transistor may be dispensed with. In addition, it is not necessary for there to be any conducting path from the gate terminal of the field-effect transistor to the external supply voltage. Thus, glitches on the external supply voltage have no direct influence on the gate potential of the regulating transistor. Rather, it is possible to provide a blocking capacitor to ground at the gate of the regulating transistor, which results in a robust locked loop with very good suppression of high-frequency interferences on the external supply voltage.

In a further embodiment, the bipolar transistor has a depletion-type high-voltage field-effect transistor, a supply current flowing through the source-drain path thereof, whose gate terminal is connected to a reference potential and whose threshold voltage is higher than the internal supply voltage, and a low-voltage regulating transistor, the supply current flowing through the collector-emitter path or source-drain path thereof, connected to it in series, the control terminal of the low-voltage regulating transistor being connected to the output of a voltage regulation circuit. Such a circuitry offers the advantage that the actual voltage regulation is performed by a low-voltage regulating transistor. Such a low-voltage regulating transistor exhibits better control behavior than a high-voltage transistor. The depletion-type high-voltage field-effect transistor is connected as a source follower. Thus, the source potential is maintained largely constant, since the gate terminal is connected to the reference potential. With this connection, the source potential is substantially determined by the threshold voltage of the high-voltage field-effect transistor. Thus, the high-voltage field-effect transistor limits the voltage applied at the actual low-voltage regulating transistor, and performs pre-stabilization. The additional expenditure for the additional regulating transistor, which may be configured both as a field-effect transistor and as a bipolar transistor, is low.

BRIEF DESCRIPTION OF THE DRAWINGS

Preferred embodiments of the present invention will be explained below in more detail with reference to the accompanying figures. In addition, the figures also show several priorly known examples of circuits for reverse-connect protection and voltage regulation.

DETAILED DESCRIPTION

Figure 1A:
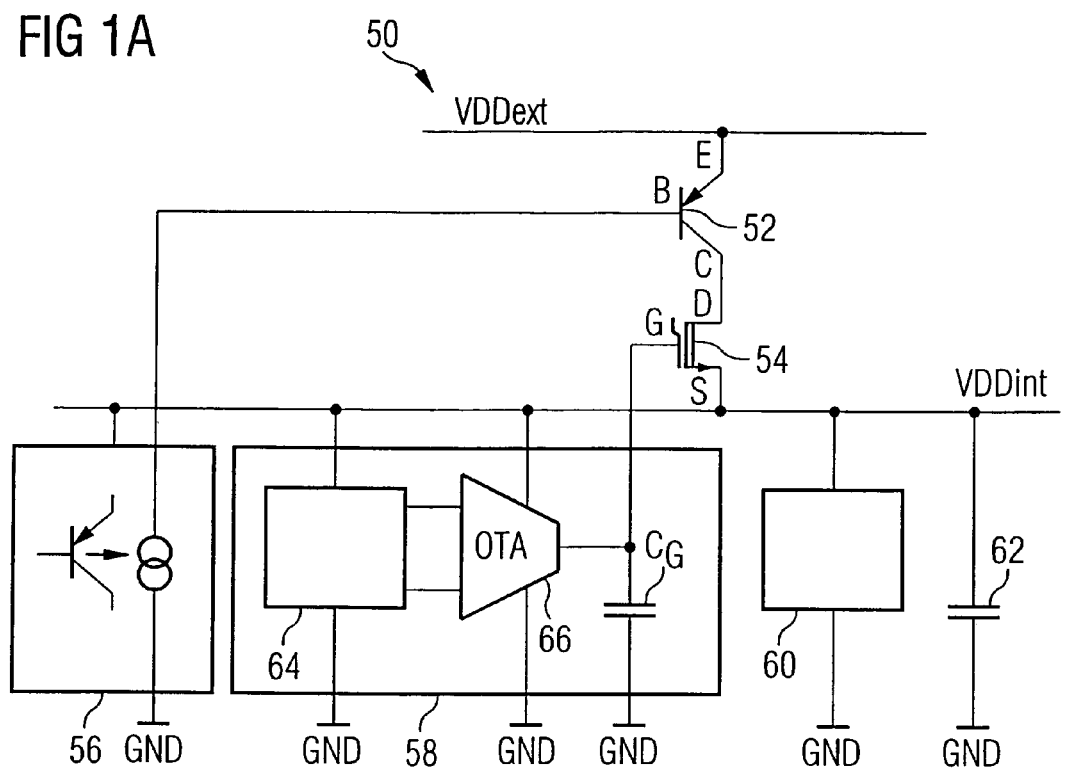
FIG. 1a shows a circuit diagram of a first embodiment of an inventive current supply circuit.

FIG. 1a shows a circuit diagram of a first embodiment of an inventive current supply circuit which is designated, in its entirety, by 50 and generates an internal supply voltage VDDint, which is protected against polarity inversion and is regulated, on the basis of an external supply voltage VDDext exhibiting large variations and glitches. In this embodiment, the internal supply voltage VDDint is 2.5 volts, the external supply voltage VDDext is allowed to range between 2.7 volts and 34 volts. A lateral high-voltage pnp bipolar transistor 52 and depletion-type high-voltage n-channel MOS field-effect transistor 54 are connected in series between the external supply voltage VDDext and the internal supply voltage VDDint. Here, the emitter terminal E of the bipolar transistor lies at the external supply voltage VDDext. The collector terminal C of the bipolar transistor is connected to the drain terminal D of the field-effect transistor. The internal supply voltage VDDint is tapped at the source terminal S of the field-effect transistor. A regulating circuit for the base current of the bipolar transistor 56, a voltage regulation circuit 58 and a sensor circuit 60 are supplied with the internal supply voltage. In addition, a blocking capacitor 62 is connected to the internal supply voltage. All subcircuits use the same reference potential GND. The regulating circuit 56 for the base current of the bipolar transistor is directly connected to the base terminal B of the bipolar transistor. The voltage regulation circuit 58 consists of a "band gap" reference voltage source 64 connected to a transconductance amplifier 66. The output of the transconductance amplifier 66 is connected to a blocking capacitor $C_G$ and to the gate terminal G of the field-effect transistor.

The mode of operation of the circuitry just described will be explained in more detail below. The core of the invention is the lateral high-voltage pnp bipolar transistor 52 realizing reverse-connect protection at a low voltage drop. In the event of a polarity inversion of the external operating voltage VDDext, the base-emitter diode of the bipolar transistor 52 disables the circuit to be supplied, and thus protects it from destruction. In normal operation, i.e. with VDDext having a correct polarity, bipolar transistor 52 is kept at the limit to saturation by the regulating circuit 56 for the base current. Thus, there is only a small drop in the collector-emitter saturation voltage across the collector-emitter path of bipolar transistor 52, in particular with a low external supply voltage VDDext. This behavior is fundamentally different from that of conventional reverse-connect protection circuits, wherein the transistor is operated as a diode, i.e. with a short-circuited base-collector path. In such circuits, the voltage drop across the reverse-connect protection is typically about 0.7 V. In addition, parasitic substrate currents which are too high are avoided by the operation at the limit to saturation. The base drive current comes from a suitable regulating circuit 56 which contains a similar transistor. Since current consumption of the sensor circuit 60 is known, regulation of the base current of the actual reverse-connect protection transistor 52 may be effected by determining the base current of this transistor.

The actual regulation of the internal supply voltage is conducted with the aid of the depletion-type high-voltage n-channel MOS field-effect transistor 54 operating in source-follower operation. Source followers with high-voltage n-channel MOS field-effect transistors generally have a very good control behavior, since, on the one hand, they may be blocked against mass at the gate (dynamic compensation; the gate blocking capacitor $C_G$ is shown as part of the voltage regulation circuit in the present embodiment) and, on the other hand, exhibit a very fast load-control behavior with regard to large load jumps. Thus, both interferences on the external supply voltage and load jumps may be very well compensated. The use of an external blocking capacitor is rendered superfluous.

In addition to the reverse-connect protection transistor, field-effect regulating transistor 54 is also compatible with operation at a low voltage drop. With a low external supply voltage VDDext, the only voltage dropping at the depletion-type high-voltage n-channel MOS field-effect transistor is a voltage smaller than its saturation voltage. Altogether, with a circuitry in accordance with the embodiment shown, a very large operating-voltage range from 2.7 V to 34 V results with an internal supply voltage of 2.5 V which is protected against polarity inversion and is regulated.

In comparison with a conventional enhancement-mode-type regulating transistor, the use of a depletion-type high-voltage n-channel MOSFET entails significant simplification of the voltage regulation circuit 58 and, in particular, of controlling the regulating transistor. The gate control voltage for the depletion-type regulating transistor falls short of the regulated internal operating voltage VDDint. Thus, the regulating transistor may be driven directly by a regulating circuit operated at the internal supply voltage. Here, in particular, no further circuit measures are required which establish a direct connection with the non-regulated external supply voltage VDDext. Suppression of interferences on the external supply voltage is improved accordingly. In comparison with an enhancement-mode-type transistor, a depletion-type regulating transistor offers big benefits also with regard to the starting behavior. The depletion-type field-effect transistor is conductive if the potential at its gate terminal equals the potential at its source terminal. Thus, in the circuitry shown, an internal supply voltage VDDint may be built up even if the voltage regulation circuit is not yet supplied with a voltage sufficient for regulated operation. By contrast, with an enhancement-mode-type field-effect transistor, the gate potential must be larger than the source potential for the transistor to become conductive. At the start of the regulating circuit, this may be achieved only by a conducting connection with the external supply voltage VDDext, which allows the coupling-in of glitches from the external supply voltage VDDext onto the voltage regulation circuit. Thus, it may be stated that when using a depletion-type field-effect transistor as a regulating transistor, a very reliable starting behavior is guaranteed without the use starting paths to the external supply voltage.

In the embodiment described here, the voltage regulation circuit includes a "band gap" reference voltage source 64, a transconductance amplifier 66 and a blocking capacitor $C_G$. The actual voltage regulation is performed by means of the transconductance amplifier 66 which is connected in a manner suitable to drive the depletion-type high-voltage n-channel MOSFET 54 with a control voltage of between 0 volt and 2.5 volts. Moreover, it is to be noted that the entire voltage regulation circuit is operated with the regulated internal supply voltage VDDint, so that it is not directly influenced by interferences on the external supply voltage VDDext.

Regulating circuit 56 for the base current of the bipolar transistor 52 in this embodiment includes a further bipolar transistor for a replica circuit, the bipolar transistor being similar to the actual reverse-connect protection transistor 52. Thus, the base current may be regulated such that the reverse-connect protection transistor 52 is operated at the limit to saturation in a manner which is independent of technology and temperature.

Figure 1B:
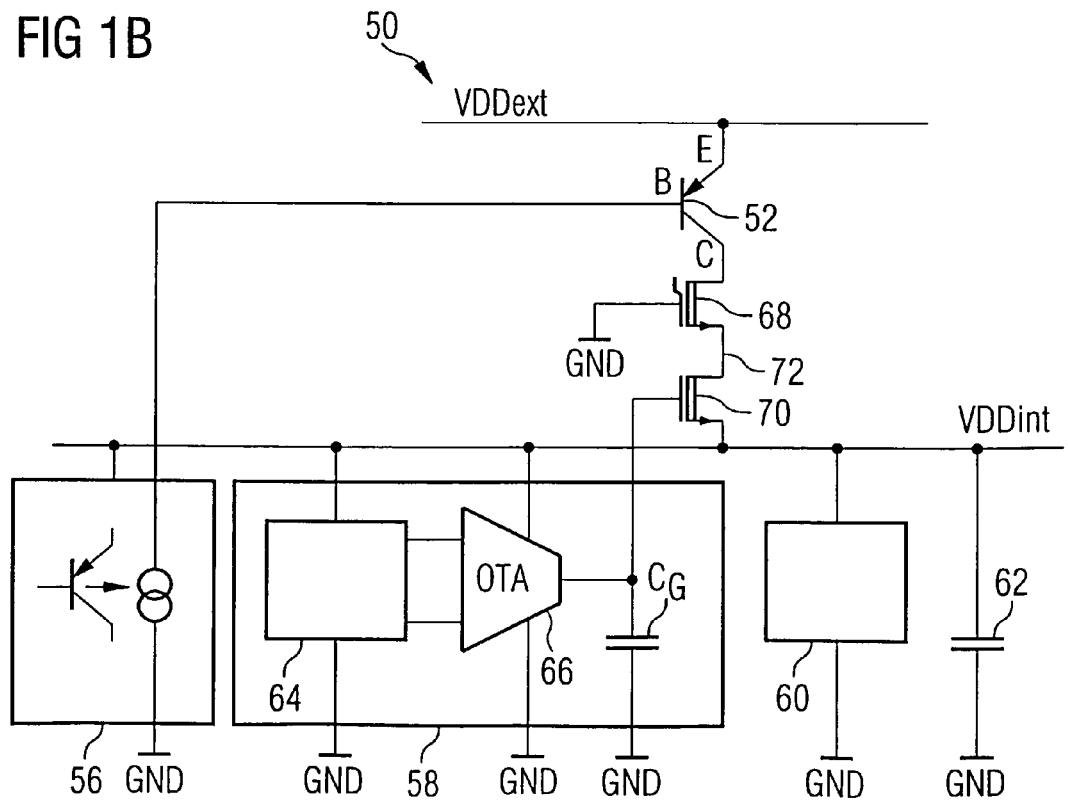
FIG. 1b shows a circuit diagram of a second embodiment of an inventive current supply circuit.

FIG. 1b shows a circuit diagram of a further embodiment of an inventive current supply circuit. This embodiment is only slightly different from that shown in FIG. 1a, so that only the changes will be discussed below. In this embodiment, voltage regulation is not effected, as is shown in FIG. 1a, by a depletion-type high-voltage n-channel MOS field-effect transistor 54, but by a two-level voltage regulation arrangement. In particular, the reverse-connect protection bipolar transistor 52 has a depletion-type high-voltage field-effect transistor 68—supply current flowing through the source-drain path thereof—as well as a low-voltage regulating transistor 70—the supply current also flowing through the source-drain path of which—connected to it in series. The gate terminal of the high-voltage field-effect transistor 68 here is connected to the reference potential GND. The control terminal of the low-voltage regulating transistor 70 is connected to the output of a voltage regulation circuit 58. In the present embodiment, the high-voltage field-effect transistor 68 is a depletion-type high-voltage n-channel MOS field-effect transistor, and the low-voltage regulating transistor 70 is a depletion-type low-voltage n-channel MOS field-effect transistor. In such a circuitry, the depletion-type high-voltage field-effect transistor 68 pre-stabilizes the supply voltage, so that there is now only a very small voltage drop at the low-voltage regulating transistor 70. The pre-stabilized voltage is applied to a knot 72 connected to the source terminal of the high-voltage n-channel MOS field-effect transistor 68 and the drain terminal of the low-voltage regulating transistor 70. An advantage of this circuitry is that the low-voltage regulating transistor 70 typically exhibits better regulating properties than a high-voltage regulating transistor 54. With such a circuitry, improved voltage stabilization may thus be achieved without major technological expenditure.

In a further embodiment of the circuitry of FIG. 1b, a low-voltage bipolar transistor may be used as the low-voltage regulating transistor 70, the supply current flowing through the collector-emitter path. In this case, the drive circuit connected to the base terminal of the bipolar transistor may be adjusted accordingly.

In addition, it is possible to replace the depletion-type high-voltage n-channel MOS field-effect transistor with another type of transistor. In particular, a barrier-layer field-effect transistor may be used which, with a very similar electrical behavior, may be produced by means of a different technological process. It is also possible to use an enhancement-mode-type field-effect transistor if it is ensured, by a circuitry-related measure, that the gate potential is increased to a suitable value above the internal supply voltage required. The exact value of the gate potential depends on the internal supply voltage desired, on the threshold voltage of the field-effect transistor and the voltage swing required for regulation by the low-voltage regulating transistor. The gate potential may either be generated by a charge pump from the internal supply voltage or by a stabilization circuit from the external supply voltage.

Figure 1C:
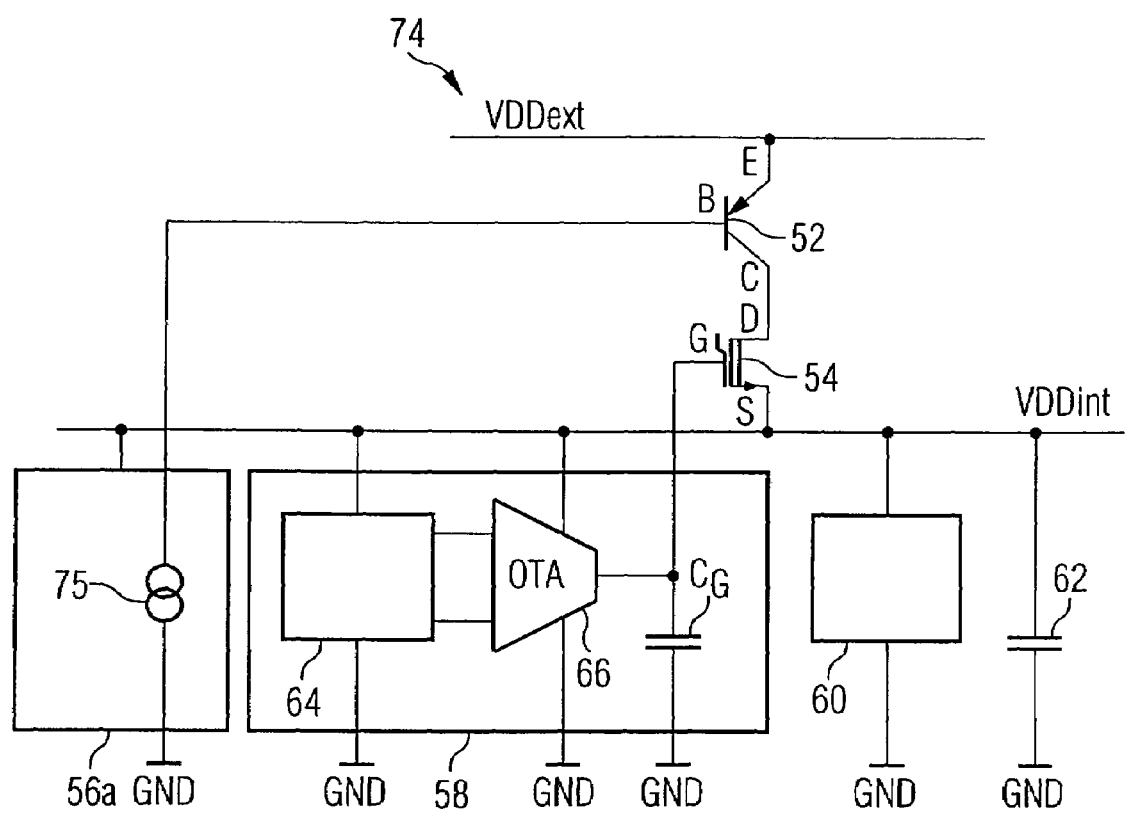
FIG. 1c shows a circuit diagram of a third embodiment of an inventive current supply circuit.

FIG. 1c shows a circuit diagram of a third embodiment of an inventive current supply circuit. The third embodiment of the inventive current supply circuit substantially corresponds to the first embodiment, shown in FIG. 1a, of the inventive current supply circuit, here being shown a concrete implementation of a current source circuit 56 for the base current of bipolar transistor 52. The current supply circuit shown in FIG. 1c is designated, in its entirety, by 74. Here, the base current of lateral high-voltage pnp bipolar transistor 52 is provided by current source circuit 56a. Current source circuit 56a substantially includes a constant-current source 75.

The current of constant-current source 75 is adjusted such that lateral high-voltage pnp bipolar transistor 52 is maintained at the limit to saturation. The current to be provided by the constant-current source here may be determined using an initial characteristics field of lateral high-voltage pnp bipolar transistor 52 if one has knowledge of the current consumed by sensor circuit 60 as well as by voltage regulation circuit 58 (as well as by current source circuit 56a, if applicable). For this purpose, a collector current of lateral high-voltage pnp bipolar transistor 52 may be determined by forming the sum of the currents consumed by voltage regulation circuit 58 and sensor circuit 60. Since the current consumptions by voltage regulation circuit 58 and sensor circuit 60 are typically known, the collector current of lateral high-voltage pnp bipolar transistor 52 may also be assumed to be known.

A initial characteristics field of a bipolar transistor, i.e. also a initial characteristics field of lateral high-voltage pnp bipolar transistor 52, shows, for a plurality of predefined base currents, one point, respectively, where the initial characteristic (which describes a connection between the collector-emitter voltage and the collector current) bends. The bending point associated with a base current represents a limit to saturation and may be described, for a base current predefined in each case, by a current value of the collector current and by a voltage value of the collector-emitter voltage. The voltage value of the collector-emitter voltage here is referred to as saturation voltage. $U_{CEsat}$ The current value for the collector current, at which the characteristic for a predefined base current bends (i.e. transitions from saturation to the active region) is referred to as a collector saturation current value associated with the predefined base current.

If one knows the initial characteristics field of lateral high-voltage pnp bipolar transistor 52, it is possible to find, for a predefined collector current, a base current associated therewith, so that the collector current equals the collector saturation current associated with the base current to be determined. In other words, the base current may be determined, from the initial characteristics field of the lateral high-voltage pnp bipolar transistor, such that lateral high-voltage pnp bipolar transistor 52 is at the limit to saturation at the predefined collector current. In other words, an operating point of lateral high-voltage pnp bipolar transistor 52 is preferably selected such that lateral high-voltage pnp bipolar transistor 52 is operated in a region of the initial characteristics field wherein the characteristic associated with the corresponding base current bends (i.e. cannot be approximated by a straight line within a good approximation). In this case, the collector-emitter voltage of lateral high-voltage pnp bipolar transistor 52 equals the saturation voltage $U_{CEsat}$ of lateral high-voltage pnp bipolar transistor 52. Thus, lateral high-voltage pnp bipolar transistor 52 is at such an operating point that with a constant base current, the collector current does not change with the collector-emitter voltage in an approximately linear manner. Thus, lateral high-voltage pnp bipolar transistor 52 is exactly at the transition between saturation and the active region. In other words, an output conductance of lateral high-voltage pnp bipolar transistor 52 (defined as a quotient of a change in the collector current and a change in the collector-emitter voltage at a constant base current) lies between an output conductance which prevails in the active operation, and an output conductance which occurs in the saturation of lateral high-voltage pnp bipolar transistor 52.

It shall be noted, in addition, that the base current of lateral high-voltage pnp bipolar transistor 52, which is provided by constant-current source 75, is allowed to deviate from an ideal current value by up to +/−10%, it being assumed that at the ideal current value for the base current, lateral high-voltage pnp bipolar transistor 52 is operated at the very limit to saturation. In addition, it is preferred for the base current of the lateral high-voltage pnp bipolar transistor to not fall short of the ideal current value and to be 20% higher, as a maximum, than the ideal current value at which the lateral high-voltage pnp bipolar transistor is operated at the very limit to saturation. In addition, a base current of the high-voltage pnp bipolar transistor which is 10% higher, as a maximum, than the ideal current value results in optimum properties of the inventive current supply circuit.

The current value for the constant-current source may also determined in another way. For example, it is possible to initially determine a reference base current value, at which the collector current of lateral high-voltage pnp bipolar transistor (52), when operated in the active region near the limit to saturation (i.e., for example, depending on the type of transistor, at a collector-emitter voltage of 0.5 V, 0.8 V, 1.0 V or 1.5 V), equals the current consumption of the circuitry to be supplied by the lateral high-voltage pnp bipolar transistor. The current value for the constant-current source 75 will then preferably be selected within a range between the reference base current value and 1.2 times the reference base current value.

Figure 1D:
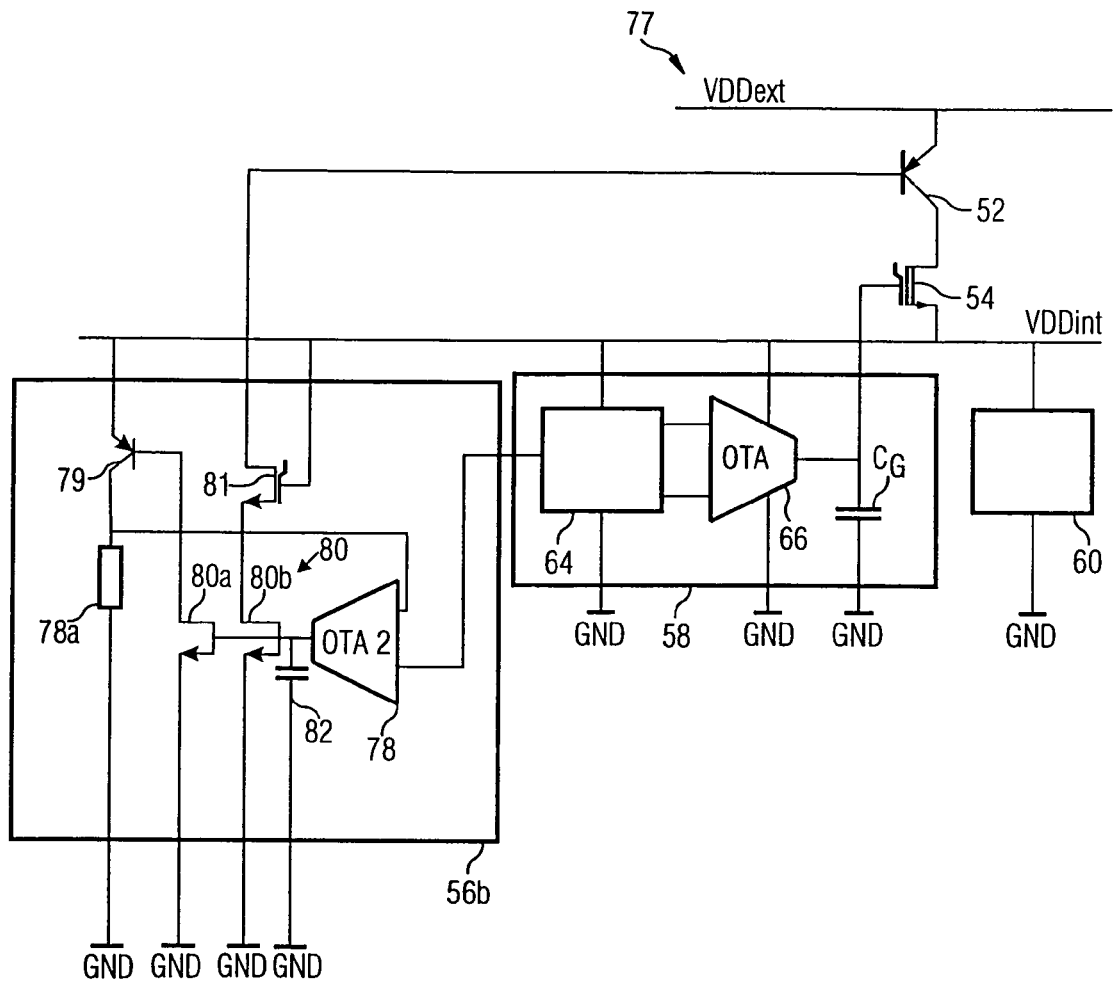
FIG. 1d shows a circuit diagram of a fourth embodiment of an inventive current supply circuit.

FIG. 1d shows a circuit diagram of a fourth embodiment of an inventive current supply circuit. The current supply circuit shown in FIG. 1d is designated, in its entirety, by 77. Since current supply circuit 77 differs from the previously described current supply circuits 50, 74 only with regard to current source 56b, which provides the base current for lateral high-voltage pnp bipolar transistor 52, substantially only current source circuit 56b will be discussed here. In addition, it is to be noted that current source circuit 56b replaces the above-described current source circuits 56 and 56a, respectively.

Current source 56b includes a control loop including a transconductance amplifier 78, a resistor 78a, a replica transistor 79 as well as a first current-bank transistor 80a. A first input of transconductance amplifier 78 here is coupled to band gap reference voltage source 64. A second input of transconductance amplifier 78 is coupled to a first terminal of resistor 78a, whereas a second terminal of resistor 78a is connected to reference potential GND. The first terminal of resistor 78a further is coupled to a collector terminal of replica transistor 79. An emitter terminal of replica transistor 79 is coupled to internal supply voltage VDDint. Finally, a base terminal of replica transistor 79 is coupled to a drain terminal of the first current-bank transistor 80a. A source terminal of first current-bank transistor 80a, in turn, is coupled to reference potential GND. Finally, a gate terminal of first current-bank transistor 80a is connected to an output of transconductance amplifier 78.

The output of transconductance amplifier 78 is further connected to a gate terminal of a second current-bank transistor 80b. A source terminal of second current-bank transistor 80b is connected to reference potential GND, whereas a drain terminal of second current-bank transistor 80b is coupled to a source terminal of a high-voltage n-channel field-effect transistor 81. Finally, a drain terminal of the high-voltage n-channel field-effect transistor 81 is coupled to the base terminal of lateral high-voltage pnp bipolar transistor 52, and a gate terminal of high-voltage n-channel field-effect transistor 81 is coupled to internal supply voltage VDDint.

In addition, current source 56b includes a capacitor 82 connected between the output terminal of transconductance amplifier 78 and reference potential GND.

It shall also be noted that replica transistor 79 is as similar as possible to lateral high-voltage pnp bipolar transistor 52. It is preferred for lateral high-voltage pnp bipolar transistor 52 and replica transistor 79 to have an identical sequence of layers.

In addition, it is to be noted that first current-bank transistor 80a and second current-bank transistor 80b form a current bank 80. Incidentally, a current bank is characterized in that currents are available at several outputs, the mutual relationships of said currents being specified by the geometry of the current-bank transistors. In addition, it is to be stated that N-channel MOS field-effect transistors are preferably used for current-bank transistors 80a, 80b.

Based on the above structural description, a detailed explanation will be given below of the mode of operation of current source circuit 56b, which serves as a drive circuit for lateral high-voltage pnp bipolar transistor 52. Here, a voltage created in band gap reference voltage source circuit 64 is copied over onto resistor 78a, so that a predetermined current, which at the same time constitutes the collector current of replica pnp transistor 79, flows through resistor 78a. Copying of the voltage created by band gap reference voltage source 64 is effected by transconductance amplifier 78, which is connected as a regulating amplifier. A regulated current is injected into the base terminal of replica pnp transistor 79 via a first current-bank transistor 80a of the n MOS current bank 80 from the output of the regulating transconductance amplifier (regulating OTA) 78. Due to a current amplification of replica pnp transistor 79, the base current of replica pnp transistor 79 generates a collector current of replica pnp transistor 79. The collector current of replica pnp transistor 79 is (in a compensated state) just so large as to generate, across resistor 78a, a voltage which is identical in quantity with the voltage generated within band gap reference voltage source 64. In other words, by means of transconductance amplifier 78 and first current-bank transistor 80a, the base current of replica pnp transistor 79 is compensated for such that the collector current of replica pnp transistor 79 assumes a predefined value, which results as a quotient of the voltage, which is supplied to transconductance amplifier 78 from band gap reference voltage source 64, and of the resistance of resistor 78a.

If the current consumption of the entire integrated circuit (i.e. of voltage regulation circuit 58, sensor circuit 60 and, if applicable, of current source circuit 56b) is known due to the circuit details being known, this current consumption may be replicated on a smaller scale (in a scaled manner) at resistor 78a and at the collector of replica pnp transistor 79. In other words, the regulating circuit, consisting of transconductance amplifier 78, resistor 78a, replica pnp transistor 79, and first current-bank transistor 80a, is configured such that the collector current flowing through replica pnp transistor 79 has a predetermined and known ratio to a current consumption of the entire integrated circuit, i.e. substantially of voltage regulation circuit 58 and sensor circuit 60. It is preferred for the collector current of replica pnp transistor 79 to be smaller than the current flowing through the voltage regulation circuit and the sensor circuit so as to keep overall current consumption as low as possible. Incidentally, it is to be noted that the current consumption of the entire integrated circuit (i.e. of voltage regulation circuit 58, sensor circuit 60 and current source circuit 56b) is typically known, since currents of the entire integrated circuit are often mirrored and/or are deviated from band gap reference voltage source 64 and are thus accurately defined.

The base current of replica pnp transistor 79, in turn, is scaled by first current-bank transistor 80a and second current-bank transistor 80b of current bank 80. In other words, the base current of replica pnp transistor 79 flows, in an amplified or equally-sized quantity, from a second output (the drain terminal of second current-bank transistor 80b) of n MOS current bank 80. The drain current of second current-bank transistor 80b, which corresponds to the scaled and/or amplified base current of replica pnp transistor 79, is used, via an n MOS high-voltage cascode formed by high-voltage n-channel field-effect transistor 81, for controlling lateral high-voltage pnp bipolar transistor 52. High-voltage n-channel field-effect transistor 81 here enables that for second current-bank transistor 80b, a field-effect transistor having a low dielectric strength may be used, the structure of which is identical with that of current-bank transistor 80a (but may have a different channel width for scaling the currents).

It shall be noted, incidentally, that the drain currents of the two current-bank transistors 80a, 80b are, within a good approximation, proportional to the respective channel widths, since the gate-source voltages of both current-bank transistors are identical. Thus, the current-bank transistors of current bank 80 are suited to scale a current. Depending on the configuration of the channel widths, the drain current of second current-bank transistor 80b, which serves to control the lateral high-voltage pnp bipolar transistor, may be smaller than, equal to, or larger than the drain current of first current-bank transistor 80a.

All current mirrors used (i.e., for example, first current-bank transistor 80a, second current-bank transistor 80b, and resistor 78a) are preferably defined such that the base current supplied to lateral high-voltage pnp bipolar transistor 52 is only slightly larger than a base current required for operating the overall circuit, so that lateral high-voltage pnp bipolar transistor 52 operates at the very limit to saturation. In other words, lateral high-voltage pnp bipolar transistor 52 is supplied with a base current which is slightly larger than a reference base current that would be required to draw the current required by the integrated circuit (current source circuit 56b, voltage regulation circuit 58, sensor circuit 60) from lateral high-voltage pnp bipolar transistor 52 as a collector current if the lateral high-voltage pnp bipolar transistor were operated in an active region (forward operation) (i.e., for example, at a collector-emitter voltage of 1.0 V). It is preferred for the base current of lateral high-voltage pnp bipolar transistor 52 to not exceed by more than 20% the reference base current required for operation in the active region (forward operation, e.g. at a collector-emitter voltage of 1.0 V). In addition, it is preferred for the base current of lateral high-voltage pnp bipolar transistor 52 to not exceed by more than 10% a reference base current required when operating lateral high-voltage pnp bipolar transistor 52 in the active operating region. This may be achieved by configuring current bank 80 and resistor 78a in a suitable manner.

Replica pnp transistor 79 is preferably operated in the active region (forward operation), wherein, as has been described above, replica transistor 79 has a collector current impressed onto it, which has a predetermined and known ratio to the current consumed by the overall circuit (current source circuit 56b, voltage regulation circuit 58, sensor circuit 60). Thus, the base current of replica pnp transistor 79 is a measure of how large a base current of lateral high-voltage pnp bipolar transistor 52 would have to be in order to provide the current consumed by the entire circuit in the event of operation in the active region (forward operation). To determine a base current required for operating the lateral high-voltage pnp bipolar transistor 52 in the active region, the base current of lateral high-voltage pnp bipolar transistor 52 would have to be adjusted in dependence on a ratio of the current consumed by the entire circuit, and the collector current of replica pnp transistor 79. By suitably selecting the channel widths of first current-bank transistor 80a and second current-bank transistor 80b, the base current of lateral high-voltage pnp bipolar transistor 52 may be slightly larger (for example, 20% larger as a maximum or 10% larger as a maximum) than the base current theoretically required for operation in the active region. Thus, lateral high-voltage pnp bipolar transistor 52 is reliably controlled in such a manner that lateral high-voltage pnp bipolar transistor 52 is operated at the limit to saturation.

Figure 1E:
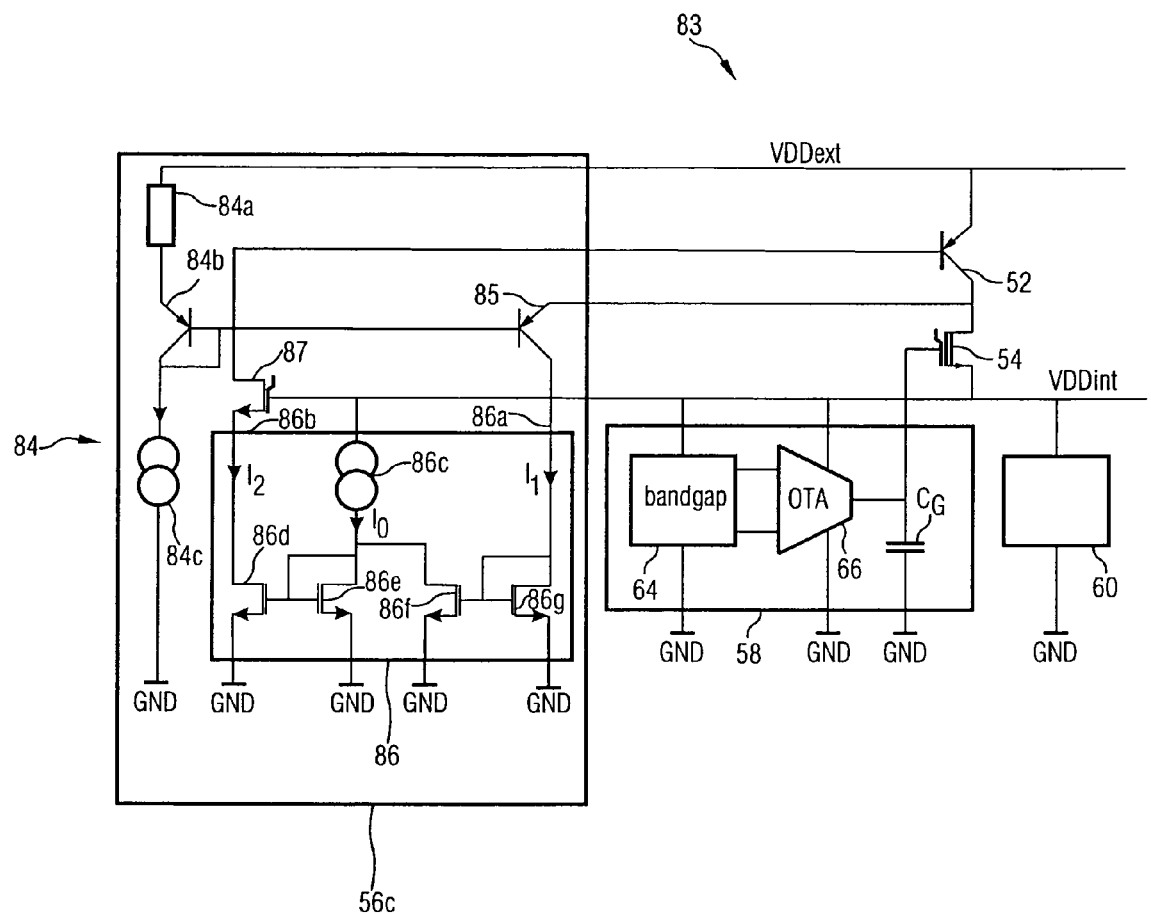
FIG. 1e shows a circuit diagram of a fifth embodiment of an inventive current supply circuit.

FIG. 1e shows a circuit diagram of a fifth embodiment of an inventive current supply circuit. The current supply circuit of FIG. 1e is designated, in its entirety, by 83. Current supply circuit 83 differs from current supply circuits 50 and 74 substantially by an altered base current regulating circuit. The base current regulating circuit of current supply circuit 83 is designated by 56c. In other words, base current regulating circuit 56c replaces current source circuits 56, 56a and 56b of current supply circuits 50 and 74.

Base current regulating circuit 56c includes a voltage source 84 consisting of a resistor 84a, a voltage source pnp bipolar transistor 84b and a current source 84c. Base current regulating circuit 56c further includes a feedback pnp bipolar transistor 85, a current mirror array 86 as well as a high-voltage n-channel field-effect transistor 87.

Resistor 84a of voltage source 84 is connected between the external supply voltage VDDext and an emitter terminal of voltage source pnp bipolar transistor 84b. A terminal and a collector terminal of voltage source pnp bipolar transistor 84b are short-circuited and are coupled to a first terminal of current source 84c. The second terminal of current source 84c is connected to reference potential GND. Current source 84c here is set such that there is a voltage drop of about 200 mV across resistor 84a. The voltage across resistor 84a, however, may also range between about 100 mV and 400 mV, depending on the type of lateral high-voltage pnp bipolar transistor used. In addition, it is to be stated that a base terminal of feedback pnp bipolar transistor 85 is coupled to the base terminal of the voltage source pnp bipolar transistor and to the collector terminal of voltage source pnp bipolar transistor 84b. Thus, the base terminal of the feedback pnp bipolar transistor has a voltage applied to it which falls short of the external supply voltage VDDext by the amount of the voltage drop across resistor 84a, plus a forward voltage of the base emitter diode of the voltage source pnp bipolar transistor.

Since, in addition, an emitter terminal of the feedback pnp bipolar transistor is coupled to the collector terminal of lateral high-voltage pnp bipolar transistor 52, what is thus achieved on the whole is that a voltage at the collector terminal of lateral high-voltage pnp bipolar transistor 52 about equals a voltage at the emitter terminal of voltage source pnp bipolar transistor 84b. In other words, base current regulating circuit 56c ensures that the collector-emitter voltage of lateral high-voltage pnp bipolar transistor 52 is about the same quantity as a voltage drop across resistor 84a, which may be set to the predefined value (between 100 mV and 400 mV, preferably about 200 mV) by current source 84c.

A corresponding collector-emitter voltage of lateral high-voltage pnp bipolar transistor 52 is achieved by regulating the base current of lateral high-voltage pnp bipolar transistor 52 in a suitable manner, as will be described below. A first terminal 86a of current mirror array 86 is connected to a collector terminal of feedback pnp bipolar transistor 85. A second terminal 86b of current mirror array 86 is connected to a source terminal of high-voltage n-channel field-effect transistor 87. A drain terminal of high-voltage n-channel field-effect transistor 87, however, is connected to the base terminal of lateral high-voltage pnp bipolar transistor 52 and accordingly provides the base current for lateral high-voltage pnp bipolar transistor 52. Finally, the gate terminal of high-voltage n-channel field-effect transistor 87 is connected to the internal supply voltage VDDint. It also is to be stated that a current flow I2 at the second terminal 86b of current mirror array 86 will be described roughly by the following circumstances.

$$I2=I0-I1.$$

Here, I0 is a predefined current flow through an internal current source 86c of current mirror array 86, and I1 is a current flow through the first terminal 86a of the current mirror array.

In summary, the following may thus be stated: a base current of lateral high-voltage pnp bipolar transistor 52, which substantially corresponds to second current flow I2, is specified as a difference between a constant current I0 and a collector current of feedback pnp bipolar transistor 85. In addition, it is to be stated that the collector current of feedback pnp bipolar transistor 85 differs only slightly from the emitter current of feedback pnp bipolar transistor 85. Finally it is to be stated that the emitter current of feedback pnp bipolar transistor 85 equals that portion of the collector current of lateral high-voltage pnp bipolar transistor 52 which is not consumed by the circuitry (consisting of base current regulating circuit 56c, voltage regulation circuit 58 and sensor circuit 60). If, as a consequence, the collector current supplied by lateral high-voltage pnp bipolar transistor 52 is larger than the current consumption by the entire circuitry, the base current of lateral high-voltage pnp bipolar transistor 52 is reduced accordingly by base current regulating circuit 56. The reduction of the base current of lateral high-voltage pnp bipolar transistor 52 results in lateral high-voltage pnp bipolar transistor 52 being operated at the limit to saturation (rather than deeply within saturation).

The details of current mirror array 86 will be discussed below. Current mirror array 86 includes a first nMOS field-effect transistor 86d, a second nMOS field-effect transistor 86e, a third nMOS field-effect transistor 86f, and a fourth nMOS field-effect transistor 86g. A drain terminal of first nMOS field-effect transistor 86d is coupled to the second terminal 86b or current mirror array 86. A source terminal of first nMOS field-effect transistor 86d, however, is coupled to reference potential GND. A gate terminal of first nMOS field-effect transistor 86d is connected to a gate terminal of second nMOS field-effect transistor 86e as well as to a drain terminal of second nMOS field-effect transistor 86e. A source terminal of second nMOS field-effect transistor 86e is coupled to reference potential GND. The drain terminal of second nMOS field-effect transistor 86e is coupled, in addition, to a drain terminal of third nMOS field-effect transistor 86f. A source terminal of third nMOS field-effect transistor 86f is connected to reference potential GND, as is a source terminal of fourth nMOS field-effect transistor 86g. Gate terminals of third nMOS field-effect transistor 86f and fourth nMOS field-effect transistor 86g are connected to one another and are further coupled to a drain terminal of fourth nMOS field-effect transistor 86g. The drain terminal of fourth nMOS field-effect transistor 86g is also coupled to first terminal 86a of current mirror array 86. In addition, first current mirror array 86 includes constant-current source 86c connected between internal supply voltage VDDint and the interconnected drain terminals of second and third field-effect transistors 86e and 86f, respectively.

What may be stated about the mode of operation of the current mirror array is that first and second nMOS field-effect transistors 86d and 86e together form a current mirror, so that second current flow I2 through second terminal 86b of current mirror array 86 substantially equals the drain current of second nMOS field-effect transistor 86e. What is also true is that a drain current of third nMOS field-effect transistor 86f substantially equals the third current flow I1 through the first terminal 86a of current mirror array 86. It may also be stated that due to the connections described, a drain current of second nMOS field-effect transistor 86e equals a difference between constant current I0 of constant-current source 86 and the drain current of third nMOS field-effect transistor 86f.

The mode of operation of base current regulating circuit 56c described may be summarized as follows: a background base current large enough for lateral high-voltage pnp bipolar transistor 52 is generated across constant-current source 86c, an nMOS current mirror (consisting of first and second nMOS field-effect transistors 86d and 86e), and an nMOS high-voltage cascode (high-voltage n-channel field-effect transistor 87). On the other hand, by means of current source 84c, a voltage is generated across resistor 84a, the voltage being, for example, 200 mV below external supply voltage VDDext, and being copied onto the collector terminal of lateral high-voltage pnp bipolar transistor 52 by means of a pnp current mirror (consisting of current source pnp bipolar transistor 84b and feedback pnp bipolar transistor 85). Thus, lateral high-voltage pnp bipolar transistor 52 operates just in the non-saturated region. Thus, a voltage which is, for example, 200 mV below external supply voltage VDDext, is generated at the emitter terminals of the two transistors of the pnp current mirror (i.e. of voltage source pnp bipolar transistor 84b and feedback pnp bipolar transistor 85).

A superfluous current at the collector terminal of lateral high-voltage pnp bipolar transistor 52 (i.e. a current not consumed by the entire circuitry) flows through a second emitter and collector of the pnp current mirror (i.e. through the emitter and collector of feedback pnp bipolar transistor 85) and is mirrored via a second nMOS current mirror (consisting of third and fourth nMOS field-effect transistors 86f and 86g) and switched to the input of the first nMOS current mirror (consisting of first and second nMOS field-effect transistors 86d and 86e). Thus, the background current coming from constant-current source 86c is reduced, and, eventually, the base current of lateral high-voltage pnp bipolar transistor 52 is set just such that the lateral high-voltage pnp bipolar transistor operates at the transition to saturation (i.e. at the limit to saturation). To put it briefly: the voltage (collector-emitter voltage) of lateral high-voltage pnp bipolar transistor 52 is regulated, and the superfluous current (that portion of the collector current of the lateral high-voltage pnp bipolar transistor which is not needed by the entire circuitry) is diverted and serves to reduce the background base current.

In other words, the base current regulating circuit 56c is adapted to reduce the base current of lateral high-voltage pnp bipolar transistor 52 compared to a predefined background base current if a collector current of the lateral high-voltage pnp bipolar transistor, which flows at a specified collector-emitter voltage of the lateral high-voltage pnp bipolar transistor, is larger than a current flow required by the circuitry to be supplied with the internal supply voltage.

The advantage that the base current regulating circuit 56*c* shown has over the current source circuit 56*b* is that the load current of the lateral high-voltage pnp bipolar transistor (i.e. the current consumption by the circuitry to be supplied by lateral high-voltage pnp bipolar transistor 52) does not need to be known exactly. Current source circuit 83 having a base current regulating circuit 56*c* thus operates in an even more reliable manner than current supply circuit 74 having current source circuit 56*b*, which merely controls the base current of the lateral high-voltage pnp bipolar transistor, but does not regulate it, as does current supply circuit 83.

Figure 2:
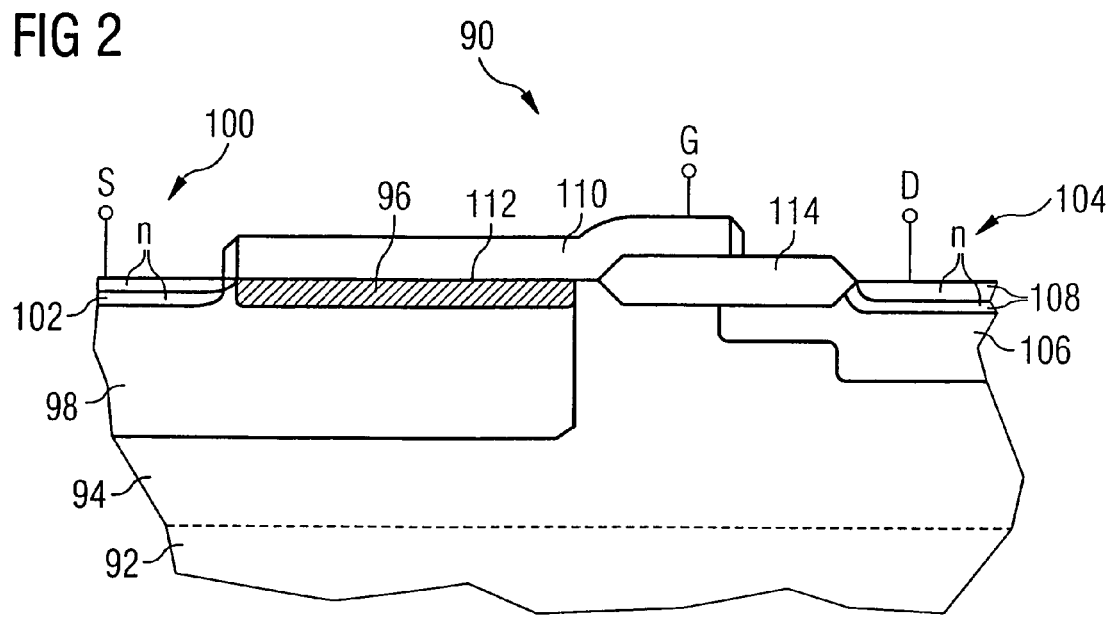
FIG. 2 shows a cross section of an enhancement-mode-type high-voltage n-channel MOSFET.
Figure 3:
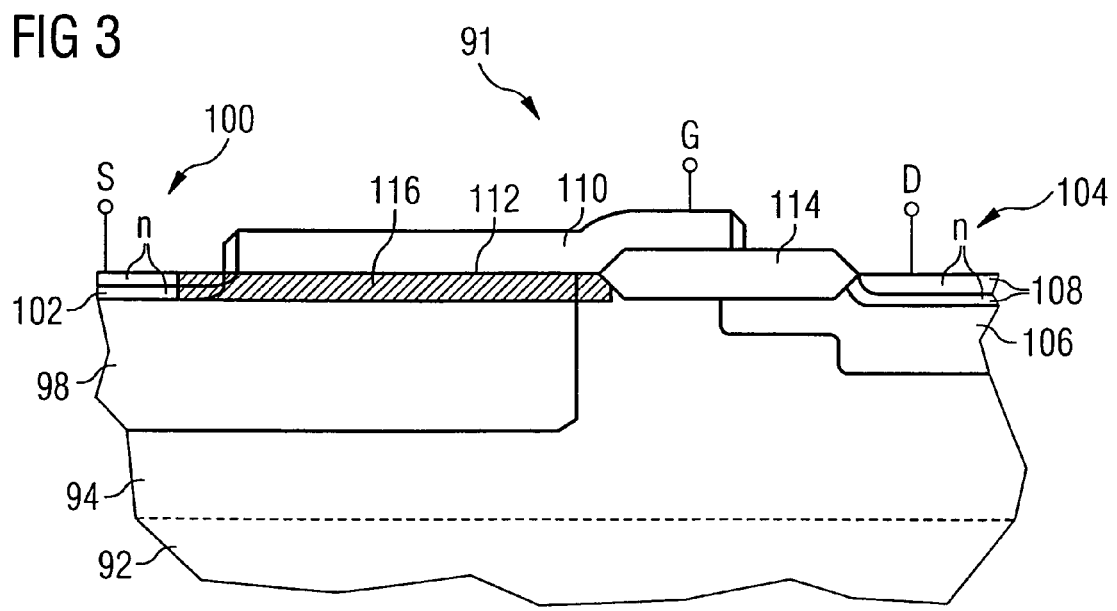
FIG. 3 shows a cross section of a depletion-type high-voltage n-channel MOSFET.
Figure 4:
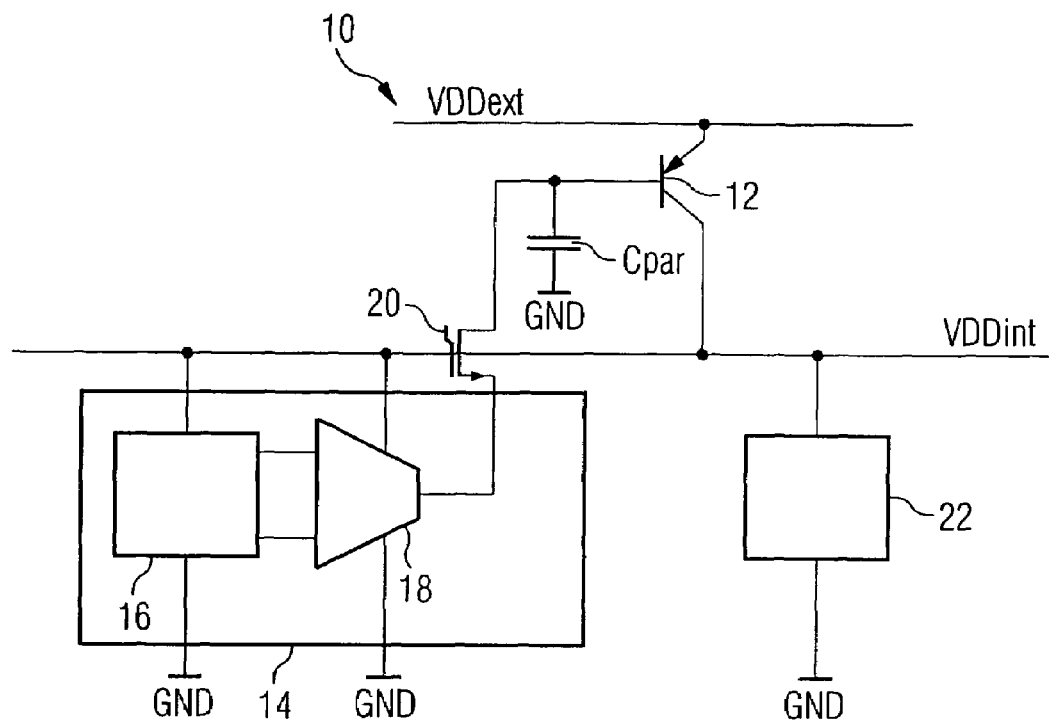
FIG. 4 shows a circuit diagram of a first example of a current supply circuit in accordance with the prior art.
Figure 5:
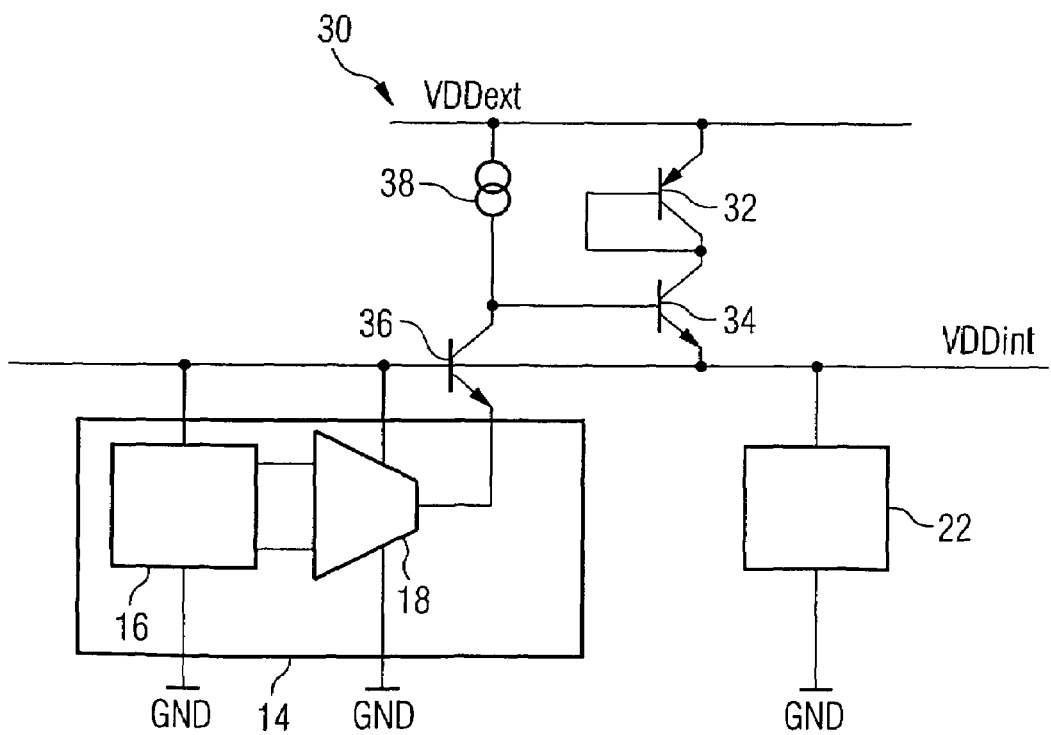
FIG. 5 shows a circuit diagram of a second example of a current supply circuit in accordance with the prior art.

FIGS. 2 and 3 show cross sections of enhancement-mode-type high-voltage n-channel field-effect transistors 90 and depletion-type high-voltage n-channel field-effect transistors 91, respectively. Both variants differ only slightly, so that they will be described jointly here, explicit reference being made to the differences. To obtain a high-voltage n-channel MOSFET, an n trough 94 suitable for high-voltage applications is implanted into a p-conductive substrate 92. This n trough may also be formed by an n epitaxy area applied onto a substrate. A p trough 98 is implanted around the channel area 96 of the transistor. The source area of transistor 100 is formed by an n-doped area 102 which, in turn, was produced in the p trough 98. The drain area 104 of the transistor includes an n trough 106 as is used in conventional CMOS technology and which is implanted into the separate n trough 94 required for high-voltage applications. Further n-conducting areas 108 are implanted into the CMOS n trough 106 for forming good contact. The gate electrode 110 is insulated from the channel area 96 by a field oxide 112. Insulation from the drain area 104 is effected by a field oxide 114. Without further process steps, an enhancement-mode-type high-voltage n-channel MOSFET may be achieved with this architecture. To provide a depletion-type high-voltage n-channel MOSFET 91, a further implantation step is necessary in addition, wherein an area 116 implantable with suitable atoms is generated in the area of the channel. In certain technologies, this implantation step has already been available for realizing other structures, so that additional process steps may be dispensed with.

It may be seen from the cross section of high-voltage n-channel MOS field-effect transistors 90, 91 that same may be manufactured within the framework of a standard CMOS process with only slight technological alterations. For high-voltage operation, a lightly doped n trough is required, in particular. As has been described above, it is also desirable to use a depletion-type field-effect transistor as the regulating transistor. Field-effect transistors manufactured by means of the conventional technology of FIG. 2 are generally depletion-type field-effect transistors. Consequently, the threshold voltage of the transistor must be changed by a suitable measure to obtain a depletion-type transistor. As is shown in FIG. 3, this may be achieved, for example, by implanting a suitable material into an area 116 below the gate electrode 110.

The technological expenditure required for this step is only an additional uncritical implantation mask. Accordingly, it is not very problematic, from a technological point of view, to achieve a circuitry in accordance with the embodiment described with reference to FIG. 1.

It is evident that the embodiments shown are not the only realizations of the present invention. The reverse-connect protection circuit as well as the voltage regulation circuit shown here may be altered within a wide range.

In one embodiment, a complementary circuitry may be used for protecting and regulating a negative supply voltage. This means that a high-voltage npn bipolar transistor connected between a negative external supply voltage and a negative internal supply voltage may be used instead of the high-voltage pnp bipolar transistor connected between the positive external supply voltage and positive internal supply voltage. This yields the benefit that circuits requiring a negative supply voltage may also be protected.

In a further embodiment, a conventional bipolar transistor and/or field-effect transistor, i.e. a bipolar transistor and/or field-effect transistor which is not suitable for high-voltage applications, may be used as long as it is ensured that it will not be destroyed by the supply voltage to be expected while taking into account any potential glitches. This allows low-cost employment of the inventive circuitry in applications where exclusively low external supply voltages occur.

In a further embodiment, the lateral high-voltage pnp bipolar transistor may be replaced with a vertical bipolar transistor. This offers the advantage that the inventive circuitry may be readily adapted to the technology available in each case. Thus, the circuitry is not only applicable in combination with CMOS circuits but also, for example, in connection with analogous technologies.

In a further embodiment, the depletion-type high-voltage n-channel MOSFET may be replaced with an enhancement-mode-type field-effect transistor. This reduces the technological expenditure, since no implantation step is required for changing the threshold voltage. However, care must be taken, by taking a suitable circuitry-related measure, that the gate potential exceeds the regulated internal supply voltage VDDint. Such a gate potential may be achieved, for example, using a charge pump or by a path leading to the non-regulated external supply voltage VDDext.

In a further embodiment, the high-voltage n-channel MOSFET may be replaced by a barrier-layer field-effect transistor. Such a barrier-layer field-effect transistor exhibits the same favorable properties as a depletion-type MOS field-effect transistor, but requires, during its production, no additional implantation step for changing the threshold voltage. The production of a gate oxide suitable for high-voltage applications may also be dispensed with. Thus, the use of a barrier-layer field-effect transistor as a regulating transistor represents a further technological alternative.

In a further embodiment, an npn bipolar transistor may also be used as a regulating transistor instead of a field-effect transistor. This fact entails increased freedom in circuit design.

In a further embodiment, the regulating circuit for the base current of the bipolar transistor may be modified as long as it is ensured that the bipolar transistor is operated at the limit to saturation.

In a further embodiment, the voltage regulation circuit may be modified. In particular, a different reference voltage source may be used instead of the "band gap" reference voltage source. It is also possible to introduce further drive circuits, e.g. for switching off the internal supply voltage. In addition, a further circuit for improving the regulating properties may be connected between the output of the transimpedance amplifier and the gate terminal of the regulating transistor.

Thus, the present invention provides a circuitry which may effectively protect, at a very small voltage drop, a circuit to be supplied from polarity inversion of the external operating voltage. It may be used both on its own and in connection with a voltage regulation circuit. The production of the inventive circuitry may easily be integrated into a conventional CMOS process, but a combination with other technologies is also feasible. Altogether, operating a bipolar transistor at the limit to saturation for realizing reverse-connect protection thus represents a very universal circuit concept.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A current supply circuit for supplying a circuit with an internal supply voltage on the basis of an external supply voltage, comprising a bipolar transistor configured to provide reverse-connect protection for the current supply circuit, with a supply current flowing through the bipolar transistor's collector-emitter path, and a regulating circuit connected to the bipolar transistor configured to operate the bipolar transistor at the limit to saturation, further comprising a field-effect transistor in series with the bipolar transistor, and configured to provide a voltage regulation for the internal supply voltage, the supply current flowing through the source-drain path of said field-effect transistor, and said field-effect transistor being driven by a voltage regulation circuit.

2. A current supply circuit according to claim 1, wherein the regulating circuit connected to the bipolar transistor includes a regulating circuit for the base current.

3. A current supply circuit according to claim 2, wherein the regulating circuit for the base current includes a similarly structured bipolar transistor.

4. A current supply circuit according to claim 1, wherein the bipolar transistor is a high-voltage pnp bipolar transistor or a high-voltage npn bipolar transistor.

5. A current supply circuit according to claim 1, wherein the bipolar transistor is a lateral high-voltage pnp bipolar transistor or a lateral high-voltage npn bipolar transistor.

6. A current supply circuit according to claim 1, wherein the bipolar transistor is a vertical high-voltage pnp bipolar transistor or a vertical high-voltage npn bipolar transistor.

7. A current supply circuit according to claim 1, wherein the field-effect transistor is a depletion-type high-voltage n-channel MOSFET.

8. A current supply circuit according to claim 1, wherein the field-effect transistor is an enhancement-mode-type-high-voltage n-channel MOSFET.

9. A current supply circuit according to claim 8, wherein the gate potential of the high-voltage n-channel MOSFET is generated by means of a charge pump in dependence on the output signal of a voltage regulation circuit.

10. A current supply circuit according to claim 1, wherein the field-effect transistor is a barrier-layer field-effect transistor.

11. A current supply circuit according to claim 1, wherein the voltage regulation circuit comprises, for driving the field-effect transistor, a "band gap" reference voltage source, a transconductance amplifier, and a blocking capacitor.

12. A current supply circuit according to claim 1, wherein the voltage regulation circuit comprises, for driving the field-effect transistor, a "band gap" reference voltage source, a transconductance amplifier, and a blocking capacitor, and wherein the voltage regulation circuit is fully supplied by the internal supply voltage.

13. A current supply circuit according to claim 12, wherein the gate terminal of the high-voltage n-channel field-effect transistor is connected to the output of the transconductance amplifier in a direct manner and, in particular, without interposition of a further transistor.

14. A current supply circuit according to claim 1, further comprising a depletion-type high-voltage field-effect transistor, wherein the supply current flow through a source-drain path of the depletion-type high-voltage field-effect transistor, and has a gate terminal connected to a reference potential, and has a threshold voltage that is higher than the internal supply voltage, and wherein the field-effect transistor providing voltage regulation comprises a low-voltage regulating transistor connected in series with the depletion-type high-voltage field-effect transistor, and wherein the supply current flows through the low-voltage regulating transistor's source-drain path, and wherein a control terminal of the low-voltage regulating transistor is connected to an output of the voltage regulation circuit.

15. A current supply circuit for supplying a circuit with an internal supply voltage on the basis of an external supply voltage, comprising a bipolar transistor configured to provide reverse-connect protection for the current supply circuit, with a supply current flowing through the bipolar transistor's collector-emitter path, and a regulating circuit connected to the bipolar transistor configured to operate the bipolar transistor at the limit to saturation, wherein the regulating circuit, connected to the bipolar transistor, for operating the bipolar transistor at the limit to saturation is a constant current source adapted to impress a constant base current upon the bipolar transistor.

16. A current supply circuit according to claim 15, wherein a size of the constant base current is adapted such that a collector-emitter voltage of the bipolar transistor equals a collector-emitter saturation voltage.

17. A current supply circuit according to claim 15, wherein the constant-current source is adapted such that the constant base current is 20% larger, as a maximum, than a reference base current required for generating a collector current of the bipolar transistor which equals a current consumption by the circuit to be supplied, when operating the bipolar transistor in an active region.

18. A current supply circuit according to claim 15, wherein the constant-current source is adapted such that the constant base current equals or is 20% larger, as a maximum, than a reference base current required for generating a collector current of the bipolar transistor which equals a current consumption of the circuit to be supplied, when operating the bipolar transistor at a collector-emitter voltage of 1.0 V.

19. A current supply circuit according to claim 1, wherein the regulating circuit for operating the bipolar transistor at the limit to saturation includes a replica circuit adapted to compensate for a base current of a replica transistor such that a collector current of the replica transistor has a predefined first ratio to a load current consumed by the circuit to be supplied, and to generate a drive current which has a predefined second ratio to the base current of the replica transistor;

the regulating circuit further being adapted to feed the drive current as a base current to the bipolar transistor for realizing the reverse-connect protection;

a sequence of layers of the replica transistor equaling a sequence of layers of the bipolar transistor for realizing the reverse-connect protection; and the predefined first ratio and the predefined second ratio being selected such that the bipolar transistor for realizing the reverse-connect protection is operated at the limit to saturation.

20. A current supply circuit according to claim 19, wherein the replica transistor equals the bipolar transistor for realizing the reverse-connect protection, and is thus integrated on a substrate with the bipolar transistor for realizing the reverse-connect protection.

21. A current supply circuit according to claim 19, wherein the regulating circuit is adapted such that the replica transistor is operated in an active region.

22. A current supply circuit according to claim 19, wherein the predefined first ratio and the predefined second ratio are selected such that the drive current for the bipolar transistor for realizing the reverse-connect protection equals or is 20% larger, as a maximum, than a reference base current being required for generating a collector current of the bipolar transistor equaling the load current, when operating the bipolar transistor in an active region.

23. A current supply circuit according to claim 19, wherein the predefined first ratio and the predefined second ratio are selected such that the constant base current equals or is 20% larger, as a maximum, than a reference base current required for generating a collector current of the bipolar transistor equaling the load current, when operating the bipolar transistor at a collector-emitter voltage of 1.0 V.

24. A current supply circuit according to claim 19, which further comprises a current bank whose control input is coupled to an output of the transconductance amplifier, and which is adapted to provide the base current for the replica transistor and the drive current for the bipolar transistor for realizing the reverse-connect protection.

25. A current supply circuit for supplying a circuit with an internal supply voltage on the basis of an external supply voltage, comprising a bipolar transistor configured to provide reverse-connect protection for the current supply circuit, with a supply current flowing through the bipolar transistor's collector-emitter path, and a regulating circuit connected to the bipolar transistor configured to operate the bipolar transistor at the limit to saturation, wherein the regulating circuit is adapted to regulate a base current of the bipolar transistor for realizing the reverse-connect protection such that an emitter-collector voltage of the bipolar transistor for realizing the reverse-connect protection assumes a predefined value, the predefined value being selected such that the bipolar transistor for realizing the reverse-connect protection is operated at the limit to saturation.

26. A current supply circuit according to claim 25, wherein the predefined value equals a collector-emitter saturation voltage of the bipolar transistor for realizing the reverse-connect protection.

27. A current supply circuit according to claim 25, wherein the predefined value ranges between 100 mV and 400 mV.

28. A current supply circuit according to claim 25, wherein the regulating circuit for operating the bipolar transistor at the limit to saturation is adapted to feed a predefined base current to the bipolar transistor if a collector current of the bipolar transistor equals a current consumption by the circuit to be supplied, and to reduce the base current of the bipolar transistor as compared to the predefined base current if a collector current of the bipolar transistor exceeds a current consumption by the circuit to be supplied.

29. A current supply circuit according to claim 25, wherein the regulating circuit for operating the bipolar transistor at the limit to saturation includes a voltage source circuit, a second bipolar transistor, and a current mirror circuit having a first terminal and a second terminal;
the voltage source circuit being adapted to generate an auxiliary potential which falls short of the external supply voltage by a predefined voltage plus a flow voltage of a base-emitter path of a second bipolar transistor;
an emitter terminal of the second bipolar transistor being coupled to the collector terminal of the bipolar transistor for realizing the reverse-connect protection, a base terminal of the second bipolar transistor being coupled to the auxiliary potential, and a collector terminal of the second bipolar transistor being coupled to the first terminal of the current mirror array;
the second terminal of the current mirror array providing a base current for the bipolar transistor for realizing the reverse-connect protection;
the current mirror array being adapted such that an output current at the second terminal of the current mirror array equals a difference between a predefined constant current and an input current at the first terminal of the current mirror array; and
the predefined voltage and the predefined constant current being specified such that the bipolar transistor is operated at a limit to saturation.

30. A current supply circuit according to claim 29, wherein the predefined voltage ranges between 100 mV to 400 mV.

31. A current supply circuit configured to supply a circuit with an internal supply voltage on the basis of an external supply voltage, comprising a bipolar transistor configured to provide reverse-connect protection for the current supply circuit, with a supply current flowing through the bipolar transistor's collector-emitter path, and a regulating circuit connected to the bipolar transistor and configured to operate the bipolar transistor at the limit to saturation, wherein the regulating circuit receives a supply voltage from the internal supply voltage, the current supply further comprising a field-effect transistor in series with the bipolar transistor, and configured to provide a voltage regulation for the internal supply voltage, the supply current flowing through the source-drain path of said field-effect transistor, and said field-effect transistor being driven by a voltage regulation circuit.

* * * * *